(12) United States Patent
Son et al.

(10) Patent No.: US 11,466,382 B2
(45) Date of Patent: Oct. 11, 2022

(54) METHOD FOR MANUFACTURING RUTILE TITANIUM DIOXIDE LAYER AND SEMICONDUCTOR DEVICE INCLUDING THE SAME

(71) Applicant: POSTECH Research and Business Development Foundation, Pohang-Si (KR)

(72) Inventors: Junwoo Son, Yeongju-si (KR); Yunkyu Park, Dalseong-gun (KR); Jinheon Park, Pohang-si (KR)

(73) Assignee: POSTECH RESEARCH AND BUSINESS DEVELOPMENT FOUNDATION, Gyeonsangbuk-Do (KR)

( * ) Notice: Subject to any disclaimer, the term of this patent is extended or adjusted under 35 U.S.C. 154(b) by 0 days.

(21) Appl. No.: 17/102,948

(22) Filed: Nov. 24, 2020

(65) Prior Publication Data

US 2021/0317596 A1 Oct. 14, 2021

(30) Foreign Application Priority Data

Apr. 13, 2020 (KR) .................. 10-2020-0044651
Nov. 9, 2020 (KR) .................. 10-2020-0148269

(51) Int. Cl.
*C30B 23/06* (2006.01)
*C30B 23/02* (2006.01)
(Continued)

(52) U.S. Cl.
CPC ............ *C30B 23/025* (2013.01); *C30B 23/06* (2013.01); *C30B 29/32* (2013.01);
(Continued)

(58) Field of Classification Search
CPC ....... C30B 29/32; C30B 23/025; C30B 23/06; H01L 21/02186; H01L 21/02266; H01L 21/02293; H01L 29/12
See application file for complete search history.

(56) References Cited

U.S. PATENT DOCUMENTS 8,927,441 B2 1/2015 Huang et al.

FOREIGN PATENT DOCUMENTS

KR 10-2013-0119466 A 10/2013

OTHER PUBLICATIONS

Kim et al "Hetero epitaixial growth of vertically-aligned TiO2 nanorods on a m-cut sapphire substrate with an (001) SnO2 buffer later", CrystalEngComm 14 2012 pp. 4963-4966.*
(Continued)

*Primary Examiner* — Robert M Kunemund
(74) *Attorney, Agent, or Firm* — Harness, Dickey & Pierce, P.L.C.

(57) ABSTRACT

A method for method for manufacturing a rutile titanium dioxide layer according to the inventive concept includes forming a sacrificial layer on a substrate, and depositing a titanium dioxide ($TiO_2$) material on the sacrificial layer. The sacrificial layer includes a metal oxide of a rutile phase. An amount of oxygen vacancy of the sacrificial layer after depositing the titanium dioxide material is greater than an amount of oxygen vacancy of the sacrificial layer before depositing the titanium dioxide material. The metal oxide includes a metal different from titanium (Ti).

20 Claims, 11 Drawing Sheets

(51) Int. Cl.
*H01L 29/12* (2006.01)
*H01L 21/02* (2006.01)
*C30B 29/32* (2006.01)

(52) U.S. Cl.
CPC .. *H01L 21/02186* (2013.01); *H01L 21/02266* (2013.01); *H01L 21/02293* (2013.01); *H01L 29/12* (2013.01)

(56) References Cited

OTHER PUBLICATIONS

Nakamura et al YBCO thin films on TiO2 buffer layer deposited by RF Magnetron Sputtering, IEEE transactions of applied superconductivity, vol. 15, No. 2 Jun. 2005, pp. 3028-3030.*
Hongtao Wang et.al, "Low Temperature Epitaxial Growth of High Permittivity Rutile TiO2 on SnO2", Electrochemical and Solid-State Letters, 13 (9) G75-G78 (2010).
Mohammad Reza Bayatia et.al, "Low-temperature processing and control of structure and properties of TiO2/c-sapphire epitaxial heterostructures", Materials Research Society., vol. 28, No. 13, Jul. 14, 2013.
Yunkyu Park et al., "Directional ionic transport across the oxide interface enables low-temperatyre epitaxy of rutile TIO2", Nature Communications 11, Articla No. 1401 (2020).
Passarello, D. et al. "Metallization of Epitaxial $VO_2$ Films by Ionic Liquid Gating through Initially Insulating $TiO_2$ Layers." *Nano Lett.* 2016, 16, pp. 5475-5481.

* cited by examiner

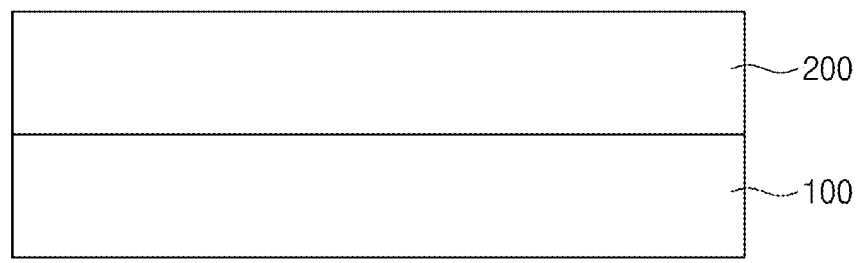
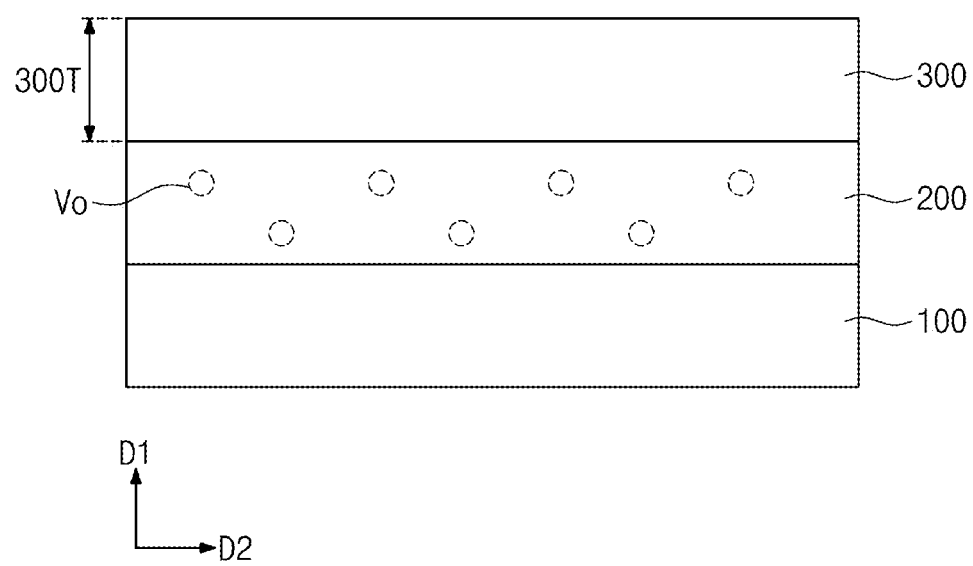

US 11,466,382 B2

METHOD FOR MANUFACTURING RUTILE TITANIUM DIOXIDE LAYER AND SEMICONDUCTOR DEVICE INCLUDING THE SAME

CROSS-REFERENCE TO RELATED APPLICATIONS

This U.S. non-provisional patent application claims priority under 35 U.S.C. § 119 of Korean Patent Application Nos. 10-2020-0044651, filed on Apr. 13, 2020, and 10-2020-0148269, filed on Nov. 9, 2020, the entire contents of which are hereby incorporated by reference.

BACKGROUND

The present disclosure herein relates to a method for manufacturing a rutile titanium dioxide layer and a semiconductor device including the rutile dioxide layer.

In semiconductor devices such as a flash memory and a DRAM, materials having high dielectric constant are required to increase the electrostatic capacity of a capacitor. As materials having high dielectric constant, titanium dioxide ($TiO_2$) is being studied.

Titanium dioxide ($TiO_2$) has three main crystal phases as follows: rutile, anatase, and brookite. The crystal phase of titanium dioxide may be dependent on conditions of growth processes such as the temperature and method of deposition. The dielectric constant of rutile titanium dioxide (90-170) is greater than the dielectric constant of anatase titanium dioxide (40 or less) and the dielectric constant of brookite titanium dioxide (40 or less).

Accordingly, study on the formation of rutile titanium dioxide at a low temperature is continuously being conducted.

SUMMARY

The present disclosure provides a method for manufacturing a rutile titanium dioxide layer at a low temperature.

An embodiment of the inventive concept provides a method for manufacturing a rutile titanium dioxide layer including forming a sacrificial layer on a substrate, and depositing a titanium dioxide ($TiO_2$) material on the sacrificial layer, wherein the sacrificial layer includes a metal oxide of a rutile phase, an amount of oxygen vacancy of the sacrificial layer after depositing the titanium dioxide material is greater than an amount of oxygen vacancy of the sacrificial layer before depositing the titanium dioxide material, and the metal oxide includes a metal different from titanium (Ti).

In an embodiment of the inventive concept, a method for manufacturing a rutile titanium dioxide layer includes forming a sacrificial layer at a first temperature on a substrate, and depositing a titanium dioxide ($TiO_2$) material in a [001] direction at a second temperature on the sacrificial layer, wherein the depositing of the titanium dioxide ($TiO_2$) material is performed under an external oxygen partial pressure ($PO_2$) of about 6 mTorr to about 24 mTorr, the second temperature is lower than the first temperature, the sacrificial layer includes a metal oxide, and the metal oxide includes a metal different from titanium.

In an embodiment of the inventive concept, a semiconductor device includes a first electrode, a metal oxide layer on the first electrode, a second electrode on the metal oxide layer, and a rutile titanium dioxide layer on the metal oxide layer and the second electrode, wherein the metal oxide layer includes a metal oxide of a rutile phase, and the metal oxide includes a metal different from titanium, the metal oxide layer includes more oxygen vacancy than the rutile titanium dioxide layer, and the metal oxide layer and the rutile titanium dioxide layer have a crystal direction of (001).

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 1 and FIG. 2 are schematic diagrams showing a method for manufacturing a rutile titanium dioxide layer according to embodiments of the inventive concept;

DETAILED DESCRIPTION

Figure 3:
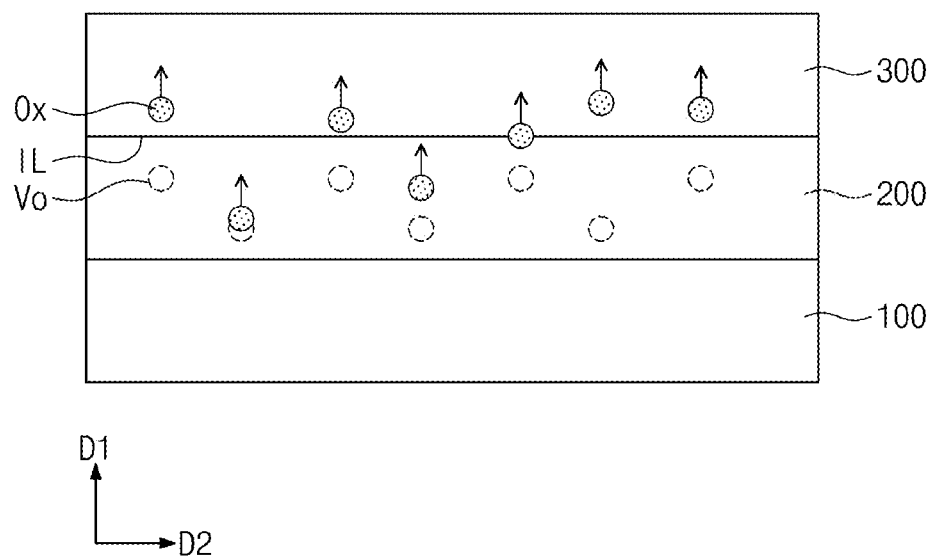
FIG. 3 is a diagram schematically showing a manufacturing process of a rutile titanium dioxide layer according to the migration of oxygen ions.

Hereinafter, embodiments of the inventive concept will be explained in more detail referring to attached drawings in order to explain the inventive concept more particularly.

FIG. 1 and FIG. 2 are schematic diagrams showing a method for manufacturing a rutile titanium dioxide layer according to embodiments of the inventive concept. Referring to FIG. 1, a substrate 100 may be provided. The substrate 100 may include, for example, a single crystalline metal oxide of (001). In an embodiment, the substrate 100 may include a single crystalline titanium dioxide ($TiO_2$).

On the substrate 100, a sacrificial layer 200 may be formed. The sacrificial layer 200 may include a metal oxide of a rutile phase. The metal oxide may include a metal material different from titanium (Ti).

The sacrificial layer 200 may grow along a first direction D1 which is perpendicular to the top of the substrate 100. The first direction D1 may be a [001] direction. A second direction D2 may be a direction which is in parallel to the top of the substrate 100. In an embodiment, the second direction D2 may be a [100] direction.

The sacrificial layer 200 may include any one among vanadium dioxide ($VO_2$), ruthenium dioxide ($RuO_2$), tin dioxide ($SnO_2$), iridium dioxide ($IrO_2$), manganese dioxide ($MnO_2$), chromium dioxide ($CrO_2$), niobium dioxide ($NbO_2$), tungsten dioxide ($WO_2$) and germanium dioxide ($GeO_2$).

The sacrificial layer 200 may be formed by epitaxial growth from the substrate 100. The sacrificial layer 200 may have a crystal direction of (001). The sacrificial layer 200 may be formed through any one method among chemical vapor deposition (CVD), atomic layer deposition (ALD) and pulse laser deposition (PLD). The sacrificial layer 200 may be formed at a first temperature, and the first temperature may be, for example, about 300° C.

Referring to FIG. 2, a rutile titanium dioxide layer 300 may be formed on the sacrificial layer 200. The formation of the rutile titanium dioxide layer 300 may include the deposition of a titanium dioxide material. The rutile titanium dioxide layer 300 may be formed through any one method among chemical vapor deposition (CVD), atomic layer deposition (ALD) and pulse laser deposition (PLD).

The rutile titanium dioxide layer 300 may be formed by epitaxial growth on the sacrificial layer 200. The rutile titanium dioxide layer 300 may be grown in a [001] direction. The rutile titanium dioxide layer 300 may have a crystal direction of (001).

The rutile titanium dioxide layer 300 may be formed at a second temperature. The second temperature may be from about 50° C. to about 150° C. The second temperature may be lower than the first temperature. That is, the formation of the rutile titanium dioxide layer 300 may be performed at a lower temperature than that for forming the sacrificial layer 200.

According to some embodiments, in case where the sacrificial layer 200 includes ruthenium dioxide ($RuO_2$), the second temperature may be from about 200° C. to about 300° C.

The formation of the rutile titanium dioxide layer 300 may be performed under external oxygen partial pressure ($PO_2$) conditions of about 6 mTorr to about 24 mTorr. According to some embodiments, the rutile titanium dioxide layer 300 may be formed better under external oxygen partial pressure ($PO_2$) conditions of about 6 mTorr to about 8 mTorr.

The rutile titanium dioxide layer 300 may have a critical thickness 300T. The critical thickness 300T may be changed according to temperature conditions and pressure conditions. The critical thickness 300T may be greater than about 0 to about 10 nm. If the titanium dioxide material is deposited to a thickness greater than the critical thickness 300T, an amorphous titanium dioxide layer may be formed.

During the forming process of the rutile titanium dioxide layer 300, oxygen vacancies Vo may be formed in the sacrificial layer 200. That is, more oxygen vacancies Vo may be observed in the sacrificial layer 200 after depositing the titanium dioxide material than the sacrificial layer 200 before depositing the titanium dioxide material.

The sacrificial layer 200 after the depositing process of the titanium dioxide material may include any one among vanadium oxide ($VO_{2-x}$), ruthenium oxide ($RuO_{2-x}$), tin oxide ($SnO_{2-x}$), iridium oxide ($IrO_{2-x}$), manganese oxide ($MnO_{2-x}$), chromium oxide ($CrO_{2-x}$), niobium oxide ($NbO_{2-x}$), tungsten oxide ($WO_{2-x}$) and germanium oxide ($GeO_{2-x}$), where x is greater than 0 and smaller than 2 ($0<x<2$).

In an embodiment, the sacrificial layer 200 after the depositing process of the titanium dioxide material may include vanadium oxide ($VO_{2-x}$), and under an external oxygen pressure of about 24 mTorr, x may have a value of 0.011, and under an external oxygen pressure of about 6 mTorr, x may have a value of 0.042. In addition, the vanadium oxide ($VO_{2-x}$) may include trivalent vanadium cations ($V^{3+}$).

The amount of oxygen vacancy of the sacrificial layer 200 after the depositing process of the titanium dioxide material may be greater than the amount of oxygen vacancy of the rutile titanium dioxide layer 300.

FIG. 3 is a diagram schematically showing the manufacturing process of a rutile titanium dioxide layer according to the migration of oxygen ions.

Referring to FIG. 3, during the forming process of the rutile titanium dioxide layer 300, oxygen ions Ox in the sacrificial layer 200 may move through an interface IL along a first direction D1.

The rutile titanium dioxide layer 300 may be formed through the nuclear formation and growth process of rutile titanium dioxide. The sacrificial layer 200 may include a metal oxide material different from the titanium dioxide material, and at the interface IL therebetween, a chemical potential difference may be generated. In order to accomplish an equilibrium state by reducing the chemical potential difference, oxygen ions Ox may migrate along the first direction D1.

Through the migration of the oxygen ions Ox, the nuclear formation and growth of rutile titanium dioxide may be thermodynamically advantageous. The loss of the oxygen ions of the metal oxide of the sacrificial layer 200 and the formation of rutile titanium dioxide may be spontaneously performed at about 50° C. to about 150° C.

In an embodiment, if the sacrificial layer 200 includes vanadium dioxide ($VO_2$) at about 150° C., the reaction for forming rutile titanium dioxide is as follows.

$$TiO_{2-x}(s)+VO_2(s) \leftrightarrow TiO_2(s)+VO_{2-x}(s)$$

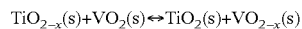

In case of the above-described vanadium dioxide ($VO_2$), ruthenium dioxide ($RuO_2$), tin dioxide ($SnO_2$), iridium dioxide ($IrO_2$), manganese dioxide ($MnO_2$), chromium dioxide ($CrO_2$), niobium dioxide ($NbO_2$), tungsten dioxide ($WO_2$) and germanium dioxide ($GeO_2$), reduction reaction may be advantageous in relation to titanium dioxide. On the contrary, in case where the sacrificial layer 200 includes a metal oxide such as aluminum oxide ($Al_2O_3$) which may be more easily oxidized than titanium dioxide, the rutile titanium dioxide layer 300 may not be formed under the temperature conditions and pressure conditions of the inventive concept.

Under a low external oxygen partial pressure ($PO_2$) of about 6 mTorr to about 24 mTorr, the migration of the oxygen ions Ox to the rutile titanium dioxide layer 300 in the first direction D1 may be achieved well. In an embodiment, under an external oxygen partial pressure of about 30 mTorr, rutile titanium dioxide may not be formed.

In a range of about 6 mTorr to about 24 mTorr, the migration of the oxygen ions Ox may be achieved better with the decrease of the external oxygen partial pressure ($PO_2$). That is, the migration of the oxygen ions Ox may be achieved better under an external oxygen partial pressure ($PO_2$) of about 6 mTorr than under an external oxygen partial pressure ($PO_2$) of about 24 mTorr.

Consequently, the low external oxygen partial pressure ($PO_2$) conditions may become the driving force of the migration of the oxygen ions Ox of the sacrificial layer 200, and oxygen with a high concentration may be supplied to the rutile titanium dioxide layer 300.

The rutile titanium dioxide layer 300 may have a critical thickness 300T. Since the migration of the oxygen ions Ox is achieved by the diffusion through the interface IL between the sacrificial layer 200 and the rutile titanium dioxide layer 300, the migration of the oxygen ions Ox may be limited to the critical thickness 300T or more.

Experimental Example 1

A $TiO_2$ single crystal substrate of a (001) direction (Shinkosha Co., Ltd.) was put in a PLD chamber. The pressure in the chamber was maintained to about $1 \times 10^{-6}$ torr.

On the $TiO_2$ single crystal substrate, a $VO_2$ sacrificial layer was epitaxially grown by pulse laser deposition (PLD) to a thickness of about 10 nm to about 14 nm. Particularly, a $V_2O_5$ powder (99.99%, Sigma Aldrich) was sintered at about 600° C. for about 6 hours to prepare a $VO_2$ target. To a rotating $V_2O_5$ target, a fluence of about 1 J/cm$^2$ and KrF excimer laser (Coherent Complex Pro 102F, $\lambda$=248 nm) were concentrated. A $VO_2$ sacrificial layer was grown under about 12 mTorr and about 300° C. After growing the $VO_2$ sacrificial layer, the temperature of the $TiO_2$ single crystal substrate was reduced to about 150° C. within about 7 minutes.

On the $VO_2$ sacrificial layer, a $TiO_2$ thin film was epitaxially grown by pulse laser deposition (PLD) to a thickness of about 2.5 nm to about 6 nm. Particularly, a $TiO_2$ powder (99.95%, Sigma Aldrich) for growing a $TiO_2$ thin film was prepared by sintering at about 1,100° C. for about 4 hours. The growing of the $TiO_2$ thin film was performed at a temperature of about 50° C. to about 150° C., and an external oxygen partial pressure ($PO_2$) was maintained between about 6 mTorr and about 24 mTorr. After finishing the growing of the $TiO_2$ thin film, the temperature was reduced to a room temperature at a rate of about 20° C./min.

Comparative Example 1

The same experiment in Experimental Example 1 was performed except for not forming a $TiO_2$ thin film.

Comparative Example 2

The same experiment in Experimental Example 1 was performed except for omitting the $VO_2$ sacrificial layer, and forming a $TiO_2$ thin film directly on the $TiO_2$ single crystal substrate.

Comparative Example 3

The same experiment in Experimental Example 1 was performed except for forming a $TiO_2$ thin film on an $Al_2O_3$ substrate of (100) instead of the $VO_2$ sacrificial layer.

Comparative Example 4

The same experiment in Experimental Example 1 was performed except for maintaining an external oxygen partial pressure ($PO_2$) to about 33 mTorr.

Experimental Example 2

The same experiment in Experimental Example 1 was performed except for using a $RuO_2$ sacrificial layer of (001) instead of the $VO_2$ sacrificial layer, and forming a $TiO_2$ thin film at about 200° C. to about 300° C.

Comparative Example 5

The same experiment in Experimental Example 2 was performed except for not forming a $TiO_2$ thin film.

Comparative Example 6

The same experiment in Experimental Example 2 was performed except for maintaining an external oxygen partial pressure ($PO_2$) to about 33 mTorr.

Figure 4A:
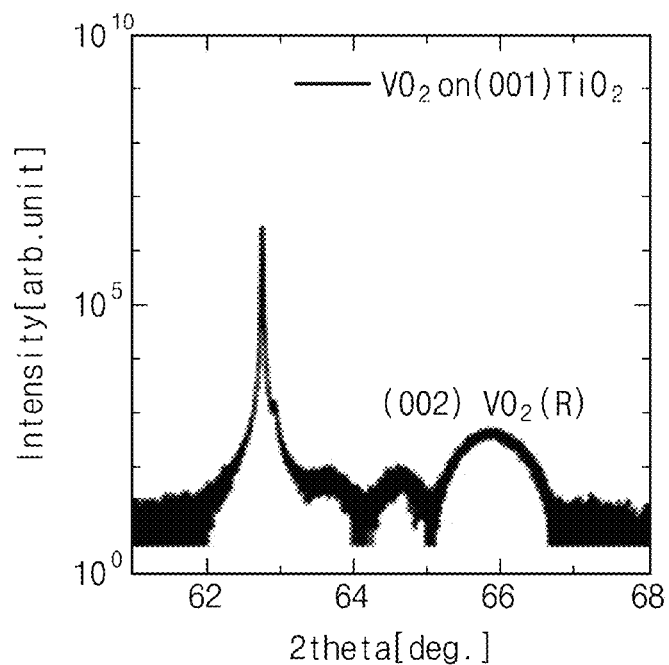
FIG. 4A is a graph showing X-ray diffraction of Comparative Example 1.
Figure 4B:
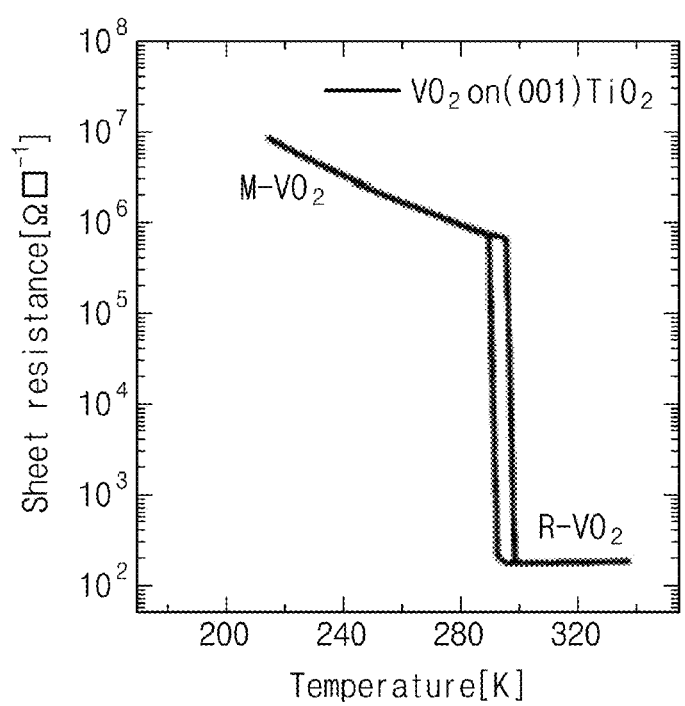
FIG. 4B is a graph showing resistance change of the sheet resistance of a $VO_2$ sacrificial layer of Comparative Example 1.

FIG. 4A is a graph showing X-ray diffraction of Comparative Example 1. FIG. 4B is a graph showing the resistance change of the sheet resistance of a $VO_2$ sacrificial layer of Comparative Example 1. Referring to FIG. 4A and FIG. 4B, the $VO_2$ sacrificial layer has high crystallinity before forming the $TiO_2$ thin film.

Figure 5A:
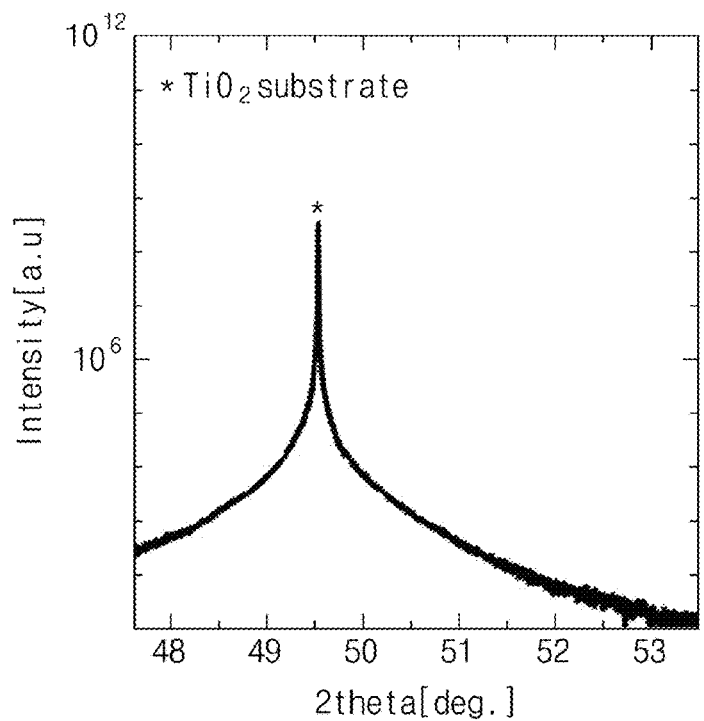
FIG. 5A and FIG. 5B are graphs showing X-ray diffraction of Experimental Example 1 and Comparative Example 2, respectively.
Figure 5B:
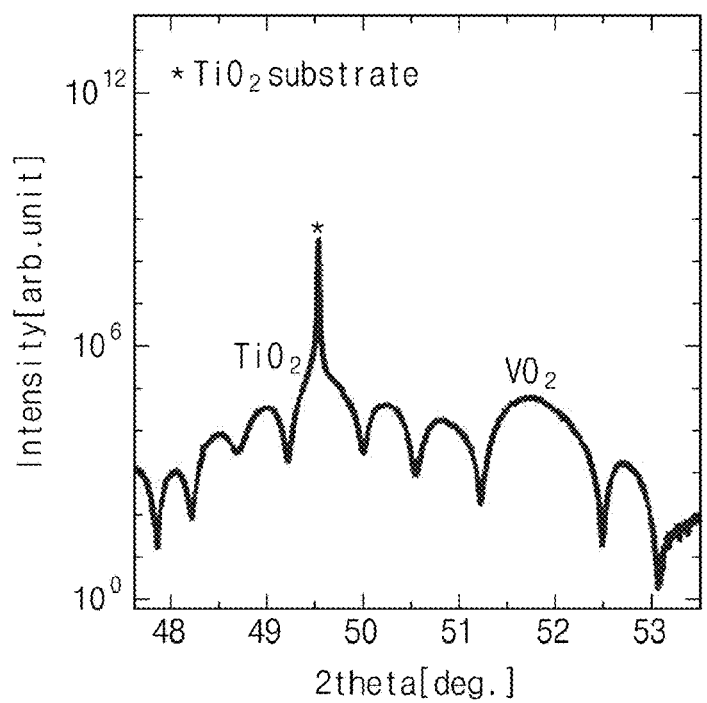

FIG. 5A and FIG. 5B are graphs showing X-ray diffraction of Experimental Example 1 and Comparative Example 2, respectively. Referring to FIG. 5A and FIG. 5B, a crystalline $TiO_2$ peak was observed in Experimental Example 1 but was unobserved in Comparative Example 2. Though not shown, in case of Comparative Example 3, only an $Al_2O_3$ peak was observed, but a crystalline $TiO_2$ peak was unobserved.

When comparing FIG. 5B with FIG. 4A, a peak at $2\theta=65.9°$ at (002) face was observed for the $VO_2$ sacrificial layer before forming the $TiO_2$ thin film, but a peak at $2\theta=51.8°$ at (002) face was observed for the $VO_2$ sacrificial layer after forming the $TiO_2$ thin film. The bragg reflection value at a (002) face of the $VO_2$ sacrificial layer after forming the $TiO_2$ thin film is smaller than a bragg reflection value at a (002) face of the sacrificial layer before forming the $TiO_2$ thin film. That is, it could be found through the peak shift of the $VO_2$ sacrificial layer during the forming process of the $TiO_2$ thin film, oxygen vacancy was formed in the $VO_2$ sacrificial layer.

Figure 6A:
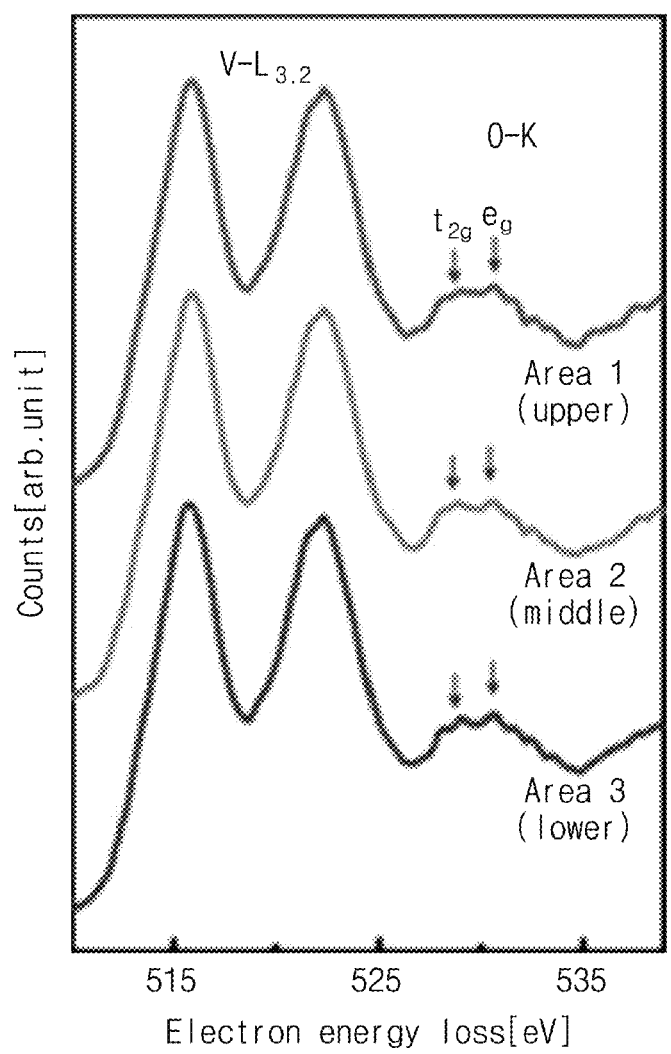
FIG. 6A shows Oxygen-K edge (hereinafter, O-K edge) and V-$L_{2,3}$ edge spectra in three areas of a $VO_2$ sacrificial layer after forming a $TiO_2$ thin film in Experimental Example 1.

FIG. 6A shows Oxygen-K edge (hereinafter, O-K edge) and V-$L_{2,3}$ edge spectra in three areas of a $VO_2$ sacrificial layer after forming a $TiO_2$ thin film in Experimental Example 1. Particularly, a first area (Area 1) is an area adjacent to the $TiO_2$ thin film, a second area (Area 2) is a middle area of the $VO_2$ sacrificial layer, and a third area (Area 3) is an area adjacent to a substrate $TiO_2$. The second area (Area 2) is positioned between the first area (Area 1) and the third area (Area 3).

Figure 6B:
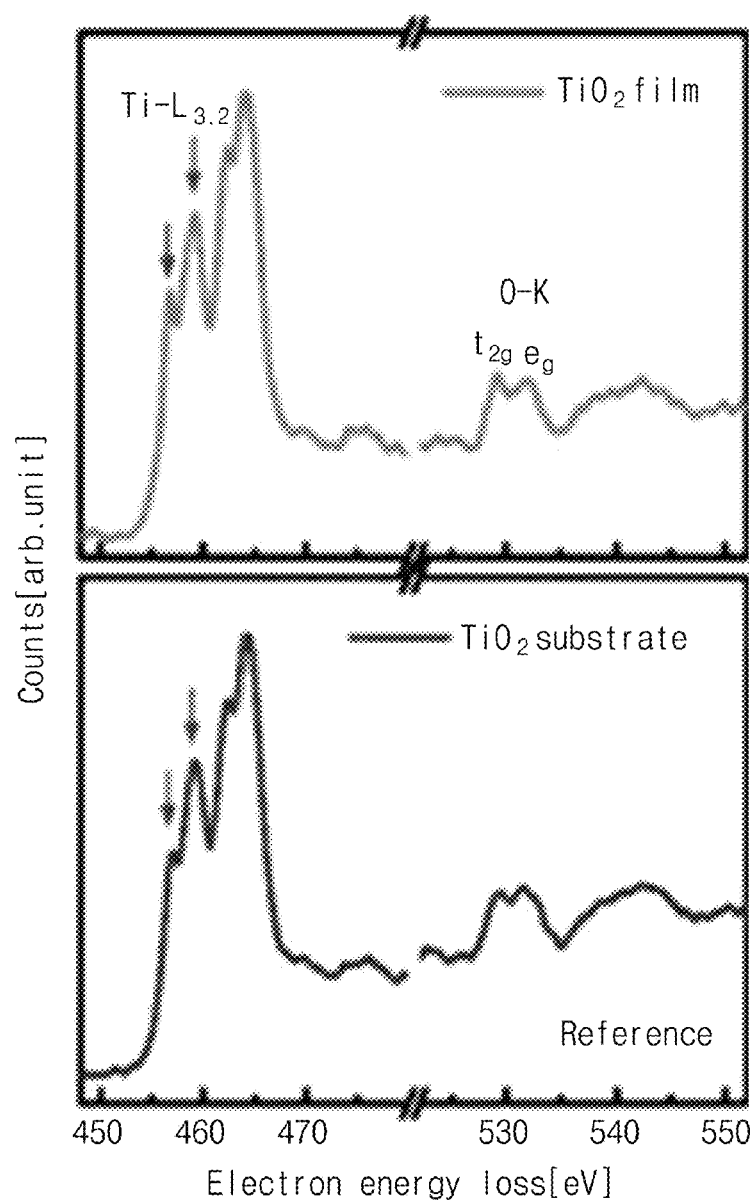
FIG. 6B shows Ti-$L_{2,3}$ edge and O-K edge of a $TiO_2$ substrate and a $TiO_2$ thin film in Experimental Example 1.

FIG. 6B shows Ti-$L_{2,3}$ edge and O-K edge of a $TiO_2$ substrate and a $TiO_2$ thin film in Experimental Example 1. When comparing FIG. 6A with FIG. 6B, it was observed that $t_{2g}$ peaks of the O-K edge of the $VO_2$ sacrificial layer were not shown well when comparing with the Ti-$L_{2,3}$ edge and O-K edge of the $TiO_2$ substrate and the $TiO_2$ thin film. From this, it could be found that different from the $TiO_2$ substrate and $TiO_2$ thin film, oxygen vacancies were formed in the $VO_2$ sacrificial layer, and vanadium (V) ions in a lower electron shell state were formed.

Figure 7:
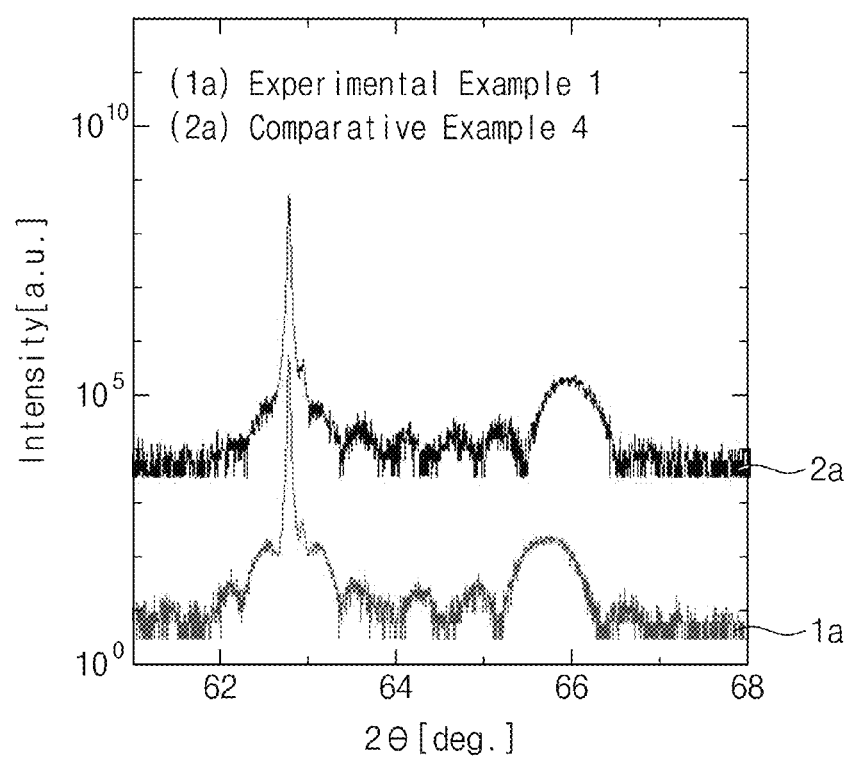
FIG. 7 is a graph showing X-ray diffraction of Experimental Example 1 and Comparative Example 4.

FIG. 7 is a graph showing X-ray diffraction of Experimental Example 1 and Comparative Example 4. Experimental Example 1 and Comparative Example 4 maintained about 150° C. Experimental Example 1 maintained an external oxygen partial pressure of about 10 mTorr. Referring to FIG.

7, in Experimental Example 1 (1a), a peak representing epitaxial $TiO_2$ around the $TiO_2$ substrate was observed, and the position of the peak of the $VO_2$ sacrificial layer was shifted to left with respect to the peak of the $VO_2$ sacrificial layer of Comparative Example 4 (2a). Relatively, in Comparative Example 4 (2a), the peak representing epitaxial $TiO_2$ was shown obscure. Through the graph, it could be found that if the external oxygen partial pressure was high (ex: $PO_2$>24 mTorr), rutile $TiO_2$ was not formed well, and the migration of oxygen in the sacrificial layer was not achieved well.

Figure 8:
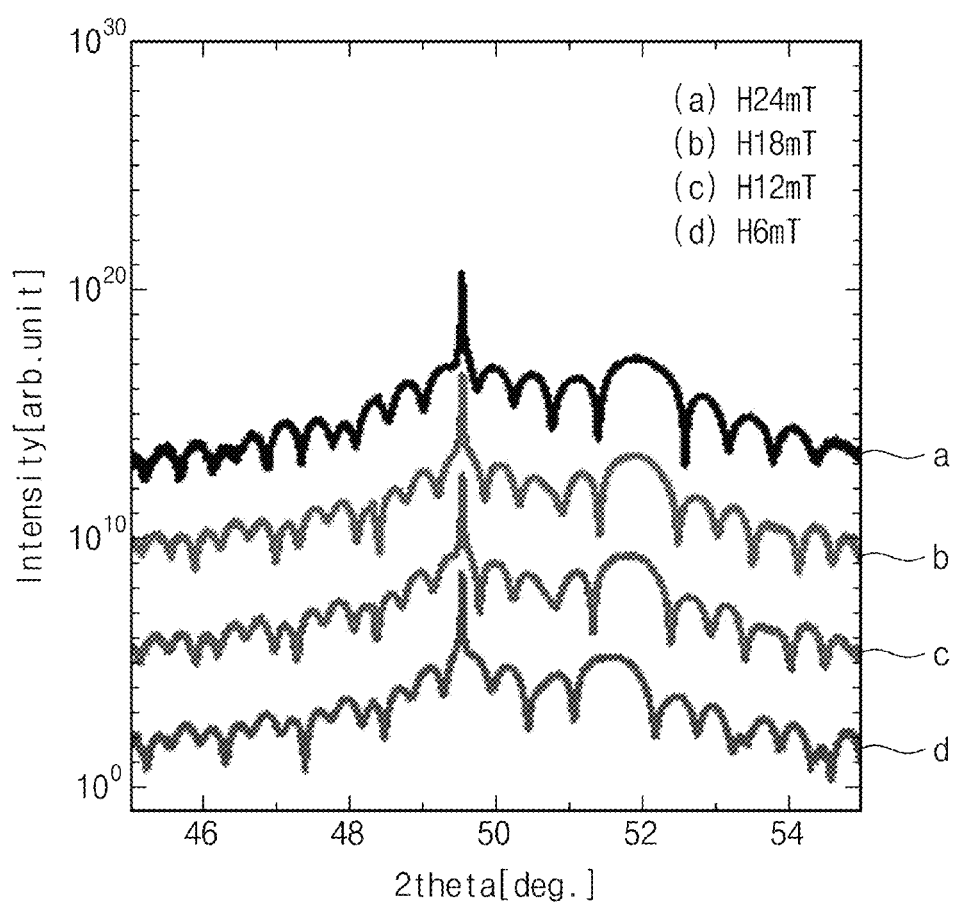
FIG. 8 is a graph showing X-ray diffraction according to the control of an external oxygen partial pressure ($PO_2$) in Experimental Example 1.

FIG. 8 is a graph showing X-ray diffraction according to the control of an external oxygen partial pressure ($PO_2$) in Experimental Example 1. Referring to FIG. 8, the positions of the peaks of the $TiO_2$ substrate and the $TiO_2$ thin film were almost the same under about 24 mTorr (H24mT) to about 6 mTorr (H6mT), but the peak of the $VO_2$ sacrificial layer was shifted. This corresponds to the expansion of the out-of-plane lattice parameters of the $VO_2$ sacrificial layer. The reflection surface of the peak corresponds to the (002) face of the $VO_2$ sacrificial layer.

Table 1 below shows data for explaining the critical thickness of the $TiO_2$ thin film according to growth time at a temperature of about 150° C. of Experimental Example 1.

TABLE 1

| Growth time | Total thickness of grown $TiO_2$ thin film | Thickness of epitaxial $TiO_2$ thin film |
| --- | --- | --- |
| 2 min | 3.5 nm or less | 3.5 nm or less |
| 4 min | 5.1 nm or less | 5.1 nm or less |
| 20 min | 14.8 nm or less | 9.9 nm or less |
| 50 min | 38.4 nm or less | 10.1 nm or less |

Referring to Table 1, according to the increase of the growth time, though the total thickness of the $TiO_2$ thin film increased, the thickness of the epitaxial $TiO_2$ thin film was maintained to a thickness of about 10 nm. Accordingly, it could be found that the $TiO_2$ thin film had a critical thickness.

Table 2 below shows data for explaining that the critical thickness of the $TiO_2$ thin film of Experimental Example 1 was different according to the change of the temperature. The growth time was controlled equally.

TABLE 2

| Growth temperature | Total thickness of grown $TiO_2$ thin film | Thickness of epitaxial $TiO_2$ thin film |
| --- | --- | --- |
| 50° C. | 6 nm or less | 3 nm or less |
| 150° C. | 6 nm or less | 6 nm or less |

Referring to Table 2, it could be found that the critical thickness of the epitaxial $TiO_2$ thin film decreased with the decrease of the growth temperature.

Figure 9:
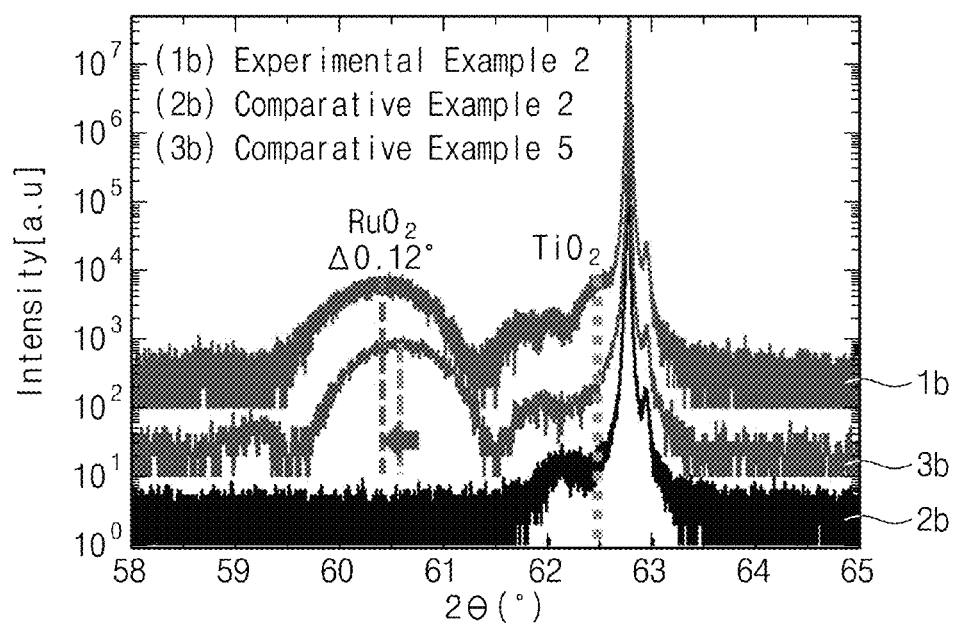
FIG. 9 shows values showing X-ray diffraction of Experimental Example 2, Comparative Example 2 and Comparative Example 5.

FIG. 9 shows values showing X-ray diffraction of Experimental Example 2, Comparative Example 2 and Comparative Example 5. In Experimental Example 2 and Comparative Example 2, $TiO_2$ thin films were formed under about 300° C. and about 8 mTorr conditions.

Referring to FIG. 9, when comparing Experimental Example 2 (1b) with Comparative Example 2 (2b), the peak of epitaxial $TiO_2$ was observed in Experimental Example 2 (1b). When comparing Experimental Example 2 (1b) with Comparative Example 5 (3b), the peak of a $RuO_2$ sacrificial layer in Experimental Example 2 (1b) was shifted by about 0.12° from that in Comparative Example 5 (3b). That is, it could be found that oxygen ions in the $RuO_2$ sacrificial layer migrated during the forming process of the $TiO_2$ thin film.

Table 3 shows the degree of shift of the $RuO_2$ sacrificial layer of Experimental Example 2 and Comparative Example 6 at a temperature of about 200° C.

TABLE 3

|  | Experimental Example 2 | Comparative Example 6 |
| --- | --- | --- |
| Peak shift of $RuO_2$ sacrificial layer | 0.2° or less | 0 or less |

Referring to Table 3, the peak of the $RuO_2$ sacrificial layer was shifted by about 0.2° in Experimental Example 2, but the peak of the $RuO_2$ sacrificial layer was substantially barely shifted in Comparative Example 6. Through this, it could be found that a low external oxygen partial pressure became the driving force of the migration of oxygen ions in the $RuO_2$ sacrificial layer.

Figure 10A:
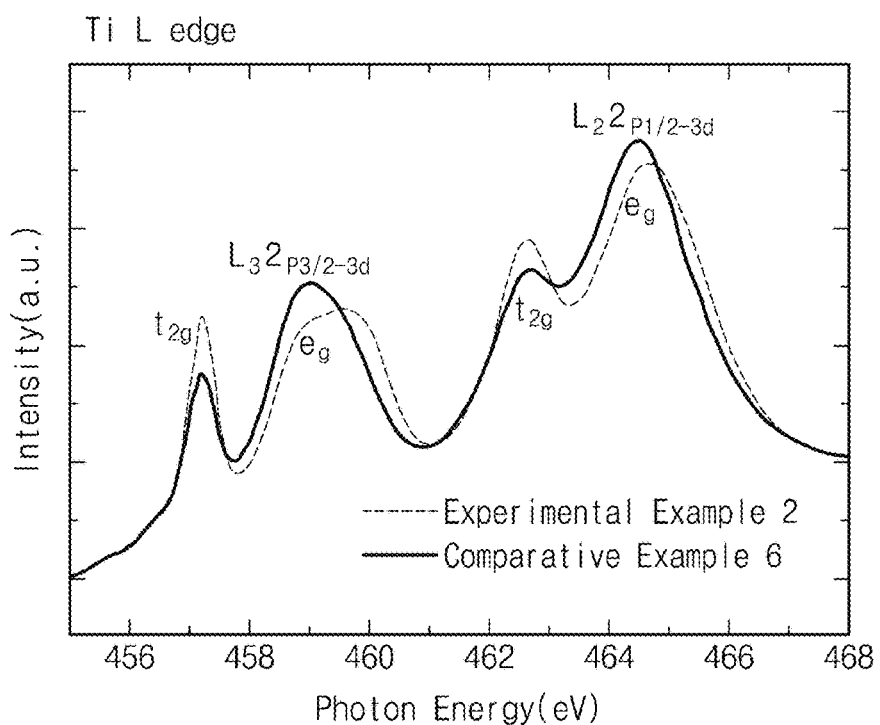
FIG. 10A shows a Ti-L edge graph of a $TiO_2$ thin film in Experimental Example 2 and Comparative Example 6.
Figure 10B:
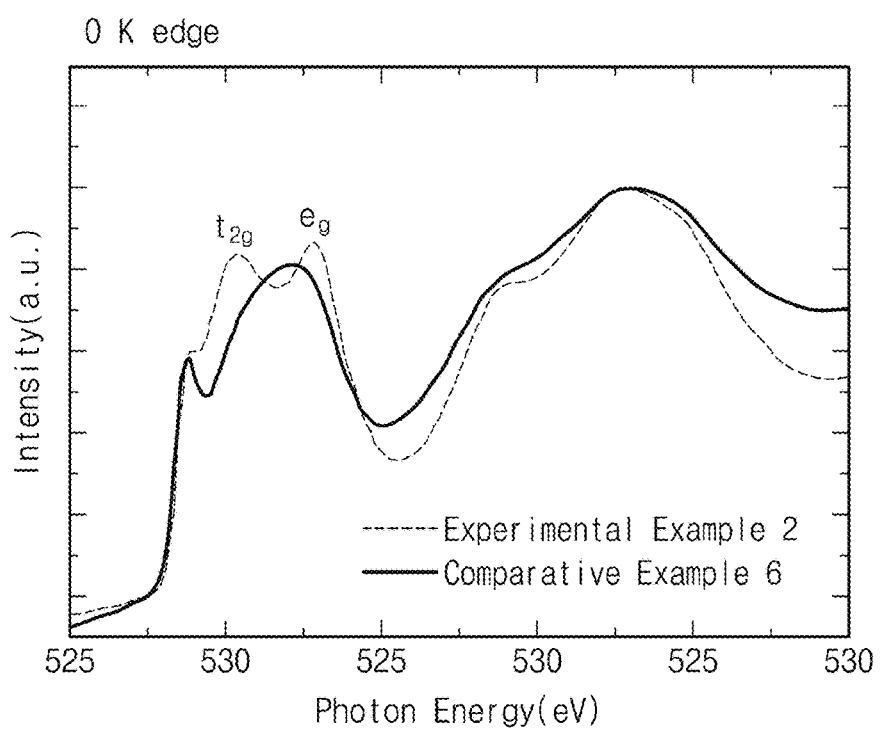
FIG. 10B shows a O-K edge graph of a $TiO_2$ thin film in Experimental Example 2 and Comparative Example 6.

FIG. 10A shows a Ti-L edge graph of a $TiO_2$ thin film in Experimental Example 2 and Comparative Example 6. FIG. 10B shows a O-K edge graph of a $TiO_2$ thin film in Experimental Example 2 and Comparative Example 6. Experimental Example 2 maintained an external oxygen partial pressure of about 6 mTorr. Referring to FIG. 10A and FIG. 10B, different from Comparative Example 6, the $TiO_2$ thin film shows a graph shape similar to $TiO_2$ with a rutile phase in Experimental Example 2.

Figure 11:
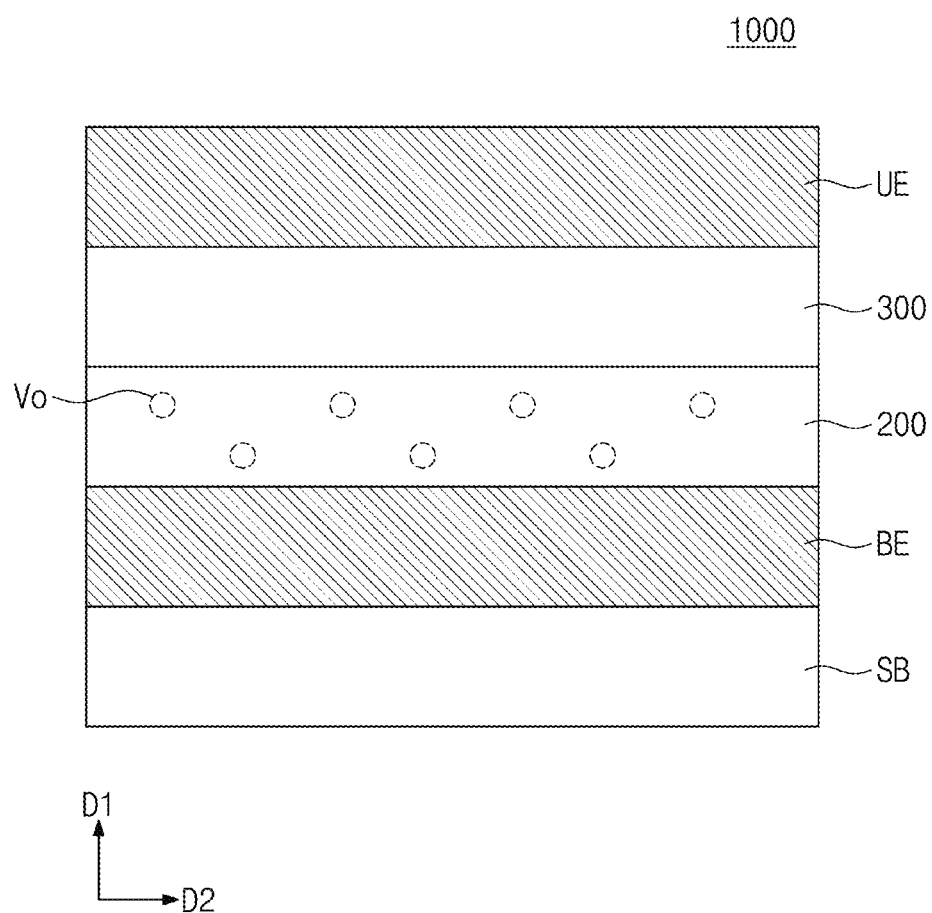
FIG. 11 is a cross-sectional view schematically showing a semiconductor device including a rutile titanium dioxide layer according to an embodiment of the inventive concept.

FIG. 11 is a cross-sectional view schematically showing a semiconductor device including a rutile titanium dioxide layer according to an embodiment of the inventive concept.

Referring to FIG. 11, a semiconductor device 1000 may include a first electrode BE disposed on a base substrate 101, a second electrode UE, a sacrificial layer 200, and a rutile titanium dioxide layer 300. On the first electrode BE, the second electrode UE may be disposed. Between the first electrode BE and the second electrode UE, the sacrificial layer 200 may be positioned. The sacrificial layer 200 may be referred to as a metal oxide layer 200. Between the sacrificial layer 200 and the second electrode UE, the rutile titanium dioxide layer 300 may be positioned.

The base substrate 101 may be a silicon single crystal substrate or a silicon on insulator (SOI) substrate. Though not shown, between the base substrate 101 and the first electrode BE, an insulating interlayer, a transistor, a contact plug, a wiring, etc., may be positioned.

Though not shown, between the base substrate 101 and the first electrode BE, the substrate 100 of FIG. 1 may be positioned. The first electrode BE, the second electrode UE, the sacrificial layer 200, and the rutile titanium dioxide layer 300 may constitute a capacitor.

According to the type of a metal oxide included, the sacrificial layer 200 may play the role of the electrode of a capacitor or a dielectric layer.

In an embodiment, in case where the sacrificial layer 200 includes any one among vanadium oxide ($VO_{2-x}$), ruthenium oxide ($RuO_{2-x}$), iridium oxide ($IrO_{2-x}$), manganese oxide ($MnO_{2-x}$), and chromium oxide ($CrO_{2-x}$), which have relatively large conductivity, the sacrificial layer 200 may play the role of the first electrode UE.

In an embodiment, in case where the sacrificial layer 200 includes any one among tin oxide ($SnO_{2-x}$), niobium oxide ($NbO_{2-x}$), and germanium oxide ($GeO_{2-x}$), which have relatively small conductivity, the sacrificial layer 200 may play the role of the dielectric layer like the rutile titanium dioxide layer 300.

The first electrode BE may also be referred to as a lower electrode. The first electrode BE may include at least one of a polysilicon layer doped with impurities, a silicon germanium layer doped with impurities, a metal nitride layer such as a titanium nitride layer, or a metal layer of tungsten, copper or aluminum. The first electrode BE may be, for example, a layer composed of a titanium nitride layer.

The second electrode UE may also be referred to as an upper electrode. The second electrode UE may include a material substantially the same material as the first electrode BE.

According to the inventive concept, the rutile titanium dioxide layer 300 may play the role of the dielectric layer of a capacitor. The rutile titanium dioxide layer 300 may be prepared by the method explained referring to FIG. 1 and FIG. 2, and may have high crystallinity even though being formed at a low temperature by using the sacrificial layer 200.

Conventionally, rutile titanium dioxide could be formed by directly forming rutile titanium dioxide or by heating anatase titanium dioxide. However, the forming method requires heating at a temperature of at least about 500° C., and there were defects of damaging other structures of a semiconductor device at the temperature of about 500° C.

According to the inventive concept, by forming rutile titanium dioxide at a temperature of about 50° C. to about 150° C. by using a sacrificial layer, the damage of a semiconductor device may be prevented, and reliability may be improved.

According to the inventive concept, a rutile titanium dioxide layer may be formed at a low temperature by using a sacrificial layer and controlling an external oxygen pressure. As a result, damages of a semiconductor device during the forming process of the rutile titanium dioxide layer may be prevented, and reliability may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing a rutile titanium dioxide layer, the method comprising:
    forming a sacrificial layer on a substrate; and
    depositing a titanium dioxide (TiO$_2$) material on the sacrificial layer,
    wherein the sacrificial layer comprises a metal oxide of a rutile phase,
    an amount of oxygen vacancy of the sacrificial layer after depositing the titanium dioxide material is greater than an amount of oxygen vacancy of the sacrificial layer before depositing the titanium dioxide material, and
    the metal oxide comprises a metal different from titanium (Ti).

2. The method for manufacturing a rutile titanium dioxide layer of claim 1, wherein the depositing of the titanium dioxide material is performed at a temperature of about 50° C. to about 150° C.

3. The method for manufacturing a rutile titanium dioxide layer of claim 2, wherein the depositing of the titanium dioxide material is performed under an external oxygen partial pressure (PO$_2$) of about 6 mTorr to about 24 mTorr.

4. The method for manufacturing a rutile titanium dioxide layer of claim 1, wherein a bragg reflection value at a (002) face of the sacrificial layer after depositing the titanium dioxide material is smaller than a bragg reflection value at a (002) face of the sacrificial layer before depositing the titanium dioxide material.

5. The method for manufacturing a rutile titanium dioxide layer of claim 1, wherein the sacrificial layer before depositing the titanium dioxide material comprises any one among vanadium dioxide (VO$_2$), ruthenium dioxide (RuO$_2$), tin dioxide (SnO$_2$), iridium dioxide (IrO$_2$), manganese dioxide (MnO$_2$), chromium dioxide (CrO$_2$), niobium dioxide (NbO$_2$), tungsten dioxide (WO$_2$) and germanium dioxide (GeO$_2$).

6. The method for manufacturing a rutile titanium dioxide layer of claim 1, wherein the sacrificial layer after depositing the titanium dioxide material comprises any one among VO$_{2-x}$, RuO$_{2-x}$, SnO$_{2-x}$, IrO$_{2-x}$, MnO$_{2-x}$, CrO$_{2-x}$, NbO$_{2-x}$, WO$_{2-x}$, and GeO$_{2-x}$, where x is greater than 0 and smaller than 2.

7. The method for manufacturing a rutile titanium dioxide layer of claim 1, wherein the sacrificial layer after depositing the titanium dioxide material comprises trivalent vanadium cations (V$^{3+}$).

8. The method for manufacturing a rutile titanium dioxide layer of claim 1, wherein the depositing of the titanium dioxide material comprises an epitaxial growth process.

9. The method for manufacturing a rutile titanium dioxide layer of claim 1, wherein the titanium dioxide material is deposited in a [001] direction.

10. The method for manufacturing a rutile titanium dioxide layer of claim 1, wherein the substrate comprises single crystalline titanium dioxide (TiO$_2$).

11. A method for manufacturing a rutile titanium dioxide layer, the method comprising:
    forming a sacrificial layer at a first temperature on a substrate; and
    depositing a titanium dioxide (TiO$_2$) material in a [001] direction at a second temperature on the sacrificial layer,
    wherein the depositing of the titanium dioxide (TiO$_2$) material is performed under an external oxygen partial pressure (PO$_2$) of about 6 mTorr to about 24 mTorr,
    the second temperature is lower than the first temperature,
    the sacrificial layer comprises a metal oxide, and
    the metal oxide comprises a metal different from titanium.

12. The method for manufacturing a rutile titanium dioxide layer of claim 11, wherein the metal oxide comprises vanadium (V), and
    the second temperature is about 50° C. to about 150° C.

13. The method for manufacturing a rutile titanium dioxide layer of claim 11, wherein the metal oxide comprises ruthenium (Ru), and
    the second temperature is about 200° C. to about 300° C.

14. The method for manufacturing a rutile titanium dioxide layer of claim 11, wherein the depositing of the titanium dioxide material comprises pulse laser deposition.

15. The method for manufacturing a rutile titanium dioxide layer of claim 11, wherein an amount of oxygen vacancy of the sacrificial layer after depositing the titanium dioxide material is greater than an amount of oxygen vacancy of the sacrificial layer before depositing the titanium dioxide material.

16. A semiconductor device, comprising:
    a first electrode;
    a metal oxide layer on the first electrode;
    a second electrode on the metal oxide layer; and
    a rutile titanium dioxide layer on the metal oxide layer and the second electrode, wherein the metal oxide layer comprises a metal oxide of a rutile phase, and the metal oxide comprises a metal different from titanium, the metal oxide layer comprises more oxygen vacancy than the rutile titanium dioxide layer, and the metal oxide layer and the rutile titanium dioxide layer have a crystal direction of (001).

17. The semiconductor device of claim 16, wherein the metal oxide layer comprises any one among vanadium oxide ($VO_{2-x}$), ruthenium oxide ($RuO_{2-x}$), $SnO_{2-x}$, $IrO_{2-x}$, $MnO_{2-x}$, $CrO_{2-x}$, $NbO_{2-x}$, $WO_2$, and $GeO_{2-x}$, where x is greater than 0 and smaller than 2.

18. The semiconductor device of claim 16, wherein a thickness of the rutile titanium dioxide layer is greater than about 0 to about 10 nm.

19. The semiconductor device of claim 16, wherein the metal oxide layer comprises trivalent vanadium cations ($V^{3+}$).

20. The semiconductor device of claim 16, wherein
the metal oxide layer comprises $VO_{2-x}$ ($0<x<2$), and
the metal oxide layer has a bragg reflection value at $2\theta=50\text{-}52°$ at a (002) face.

* * * * *